United States Patent [19]

Miller et al.

[11] Patent Number: 4,951,110
[45] Date of Patent: Aug. 21, 1990

[54] POWER SEMICONDUCTOR STRUCTURAL ELEMENT WITH FOUR LAYERS

[75] Inventors: Gerhard Miller, Penzing; Jenoe Tihanyi; Peter Wehr, both of Munich, all of Fed. Rep. of Germany

[73] Assignee: Siemens Aktiengesellschaft, Berlin and Munich, Fed. Rep. of Germany

[21] Appl. No.: 264,416

[22] Filed: Oct. 31, 1988

[30] Foreign Application Priority Data

Nov. 3, 1987 [DE] Fed. Rep. of Germany ....... 3737288

[51] Int. Cl.$^5$ .......................................... H01L 29/74
[52] U.S. Cl. .......................................................... 357/38
[58] Field of Search ............................................. 357/38

[56] References Cited

U.S. PATENT DOCUMENTS

| | | | |
|---|---|---|---|
| 3,641,403 | 2/1972 | Nakata | 357/38 |
| 3,896,477 | 7/1975 | Hutson | 357/38 |
| 4,131,487 | 12/1978 | Pearce et al. | 357/34 |
| 4,311,534 | 1/1982 | Bartko et al. | 357/38 |
| 4,443,810 | 4/1984 | Yatsuo et al. | 357/38 |
| 4,509,069 | 4/1985 | Stoisek | 357/38 |
| 4,574,296 | 3/1986 | Sueoka et al. | 357/38 |
| 4,612,449 | 9/1986 | Patalong | 357/38 |
| 4,782,379 | 11/1988 | Baliga | 357/38 |
| 4,792,839 | 12/1988 | Strack et al. | 357/38 |

FOREIGN PATENT DOCUMENTS

| | | |
|---|---|---|
| 115364 | 9/1980 | Japan . |
| 56-6432 | 1/1981 | Japan . |
| 59-139666 | 8/1984 | Japan . |
| 1124176 | 8/1968 | United Kingdom . |

OTHER PUBLICATIONS

Toshihiko Aimi, "Manufacturing Method of Semiconductor Device" Patent Abstracts of Japan, vol. 4, No. 165(E-34) p. 647, Nov. 1980.

C. W. Pearce, "A New Approach to Lattice Damage Gettering", Aug. 1979, Jour. Electrochemical Soc., vol. 126, No. 8, pp. 1436–1437.

R. A. Kokosa, "A High-Voltage High-Temperature Reverse Conducting Thyristor", Sep. 1970, IEEE Tr. Elec. Dev., Vol. 17, No. 9, pp. 667–672.

Rudolf F. Graf; Modern Dictionary of Electronics; 6th Ed., 1984; Howard W. Sams & Co.; Indianapolis, IN; p. 426.

Primary Examiner—Andrew J. James
Assistant Examiner—Viet Q. Nguyen
Attorney, Agent, or Firm—Michael B. Einschlag

[57] ABSTRACT

Semiconductor structural elements with four regions of alternating conductivity type have a stored charge characteristic which becomes apparent as so-called "tail" current upon switching off. The tail current can be reduced by means of an anode-side emitter region containing damaged regions generated by laser bombardment which extend through a pn-junction formed between the anode-side emitter region and a central region up into the central region.

5 Claims, 1 Drawing Sheet

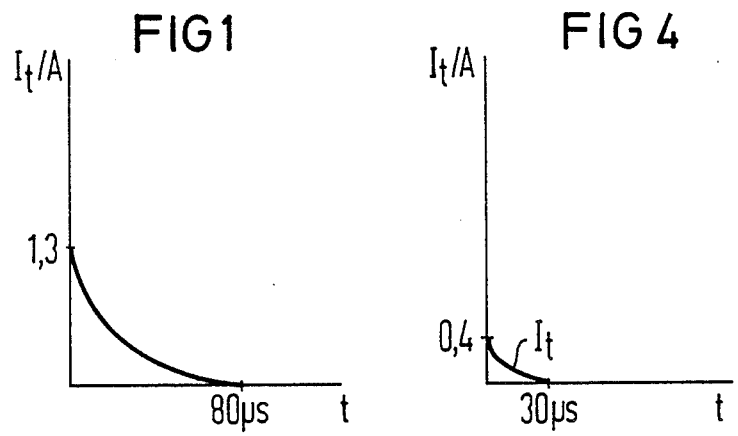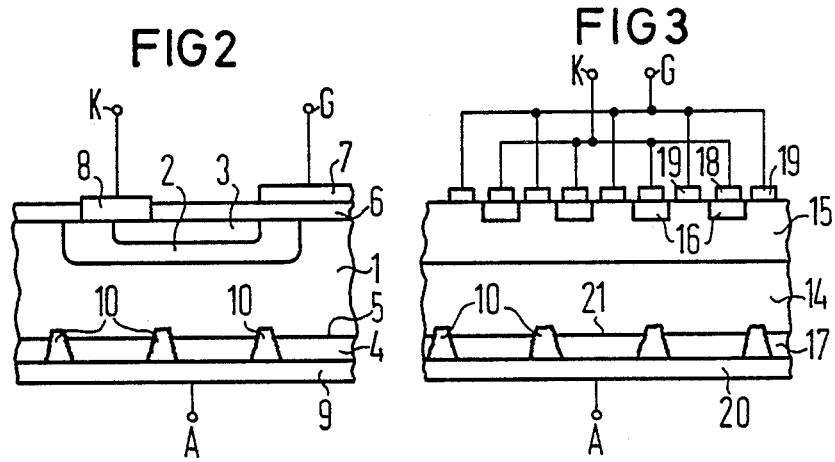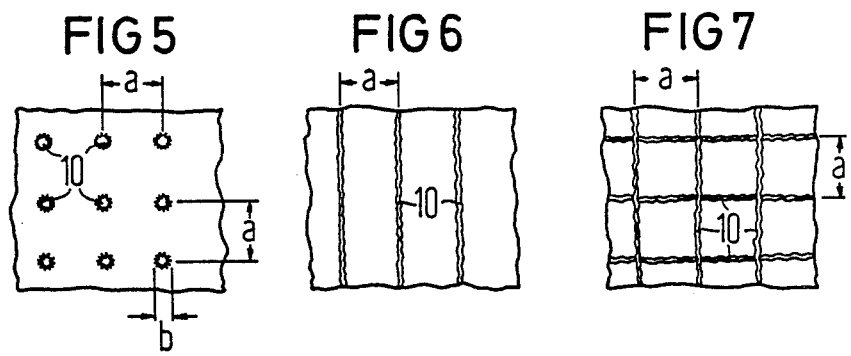

POWER SEMICONDUCTOR STRUCTURAL ELEMENT WITH FOUR LAYERS

The invention relates to a power semiconductor structural element with at least one cathode-side emitter region, at least one cathode-side base region, a central region and at least one anode-side emitter region.

Power semiconductor structural elements of this nature are generally known. Inside the semiconductor structural element, the current is transported by both charge carrier types. Because of this, a stored charge builds up which is observed as a current upon turn-off, called herein a "tail" current. As long as this current flows, the element does not block completely. Because, during the time in which the tail current flows, the voltage has already increased, a relatively high power dissipation is converted to heat inside the element.

The goal of the present invention is shortening the duration of the tail current, thus decreasing the power dissipation.

In accordance with principles of the present invention, the anode-side emitter region contains regions damaged by laser energy, which extend through the pn-junction formed between the anode-side emitter region and the central region up into the central region.

In the drawings:

FIG. 1 is a current-time diagram for the turn-off current of a conventional power semiconductor structural element with four regions;

FIG. 2 is a cross-section view through a first embodiment example;

FIG. 3 is a cross-section view through a second embodiment example,

FIG. 4 is a current-time diagram for the turn-off current of a power semiconductor structural element according to the invention; and FIGS. 5 to 7 are diagrams illustrating three different embodiment examples for the arrangement and form of the damaged regions.

The current-time diagram of FIG. 1 shows the tail current $I_t$ for a known insulated gate bipolar transistor (IGBT) for a resistive load. This current has its origin in the recombinations taking place in the semiconductor body. The tail current has an initial value of 1.3 A and stops flowing after 80 $\mu$s.

In FIG. 2, the cross-section of the semiconductor body of such an IGBT is represented. This is a bipolar transistor with four regions of alternating conductivity type which is controlled by an insulated gate. The central region is labeled 1. It is n-doped and has a first predetermined doping concentration. In the central region 1 is embedded a p-doped cathode-side base region 2 of higher doping concentration than the central region 1. In region 2, in turn, is embedded an n-doped cathode-side emitter region 3. It has a higher doping concentration than region 2. On the anode side, the semiconductor body is provided with a p-doped anode-side emitter region 4 which is more highly doped than region 1. A pn-junction 5 is formed between the central region 1 and the anode-side emitter region 4.

The cathode-side surface of the semiconductor body is provided with an insulating layer 6 on which a gate electrode 7 is disposed. The gate electrode 7 partially covers the base region where it emerges to the surface of the semiconductor body. On the side of the cathode-side base region 2 and the cathode-side emitter region 3 away from the gate electrode 7, a cathode electrode 8 is disposed which forms a strong shunt between regions 2 and 3. This shunt prevents thyristor latching. The anode-side emitter region 4 is bonded with an anode electrode 9.

The anode-side emitter region 4 is provided with damaged regions 10 which extend through the anode-side emitter region 4, penetrate through the pn-junction 5 between the central region 1 and the anode-side emitter region 4, and reach into the central region 1. The damaged regions are produced through laser energy. For this purpose any suitable laser can be used. The technique of working semiconductor structural elements with lasers is known from, for example, "Journal of the Electrochemical Society", Vol. 126, (1979) No. 8, pages 1436 and 1437. The damaged regions 10 are generated by melting produced by means of the laser energy. The energy is set so that the semiconductor body melts down to a depth which is greater than the depth of the pn-junction 5. The anode-side emitter region may have a thickness, for example, between 5 and 10 $\mu$m; the depth of regions 10 can be, for example, 2 $\mu$m greater. However, the thickness of region 4 can also be less and be of the order of magnitude of 1 $\mu$m.

Because of the damaged regions 10, the emitter efficiency of the bipolar transistor consisting of cathode-side base region 2, central region 1, and anode-side emitter region 4 is decreased, because, thereby, no or only a reduced emission of charge carriers takes place. The damaged regions 10, in addition, represent centers of increased recombination so that the charge carrier concentration in the central region 1 can be decreased. It is most strongly reduced near the pn-junction 5.

In FIG. 3 a gate turn-off (GTO) thyristor is shown. It has an n-doped central region 14, a p-doped cathode-side base region 15 in which n-doped cathode-side emitter regions 16 are embedded. It has, additionally, a p-doped anode-side emitter region 17 forming a pn-junction 21 with the central region 14. The anode-side emitter region 17 is bonded to an anode electrode 20. The doping proportions correspond to those of the semiconductor body illustrated in FIG. 2. The cathode-side emitter regions 16 are provided with emitter electrodes 18 between which gate electrodes 19 are disposed and connected with the cathode-side base region 15. The gate electrodes 19 and the emitter electrodes 18 are respectively connected in parallel. On the anode side, damaged regions 10 are provided, as in the case of the IGBT illustrated in FIG. 2, which penetrate the pn-junction 21 between the central region 14 and the anode-side emitter region 17.

The current-time diagram of FIG. 4 shows clearly the improvement of the switch-off behavior. The tail current $I_t$ starts at a current value of only 0.4 A which is lower when compared with FIG. 1 and stops flowing after only 30 $\mu$s. The power dissipation in the semiconductor body is reduced to approximately 20% of the power dissipation of the semiconductor body of FIG. 1. This was measured with an IGBT whose semiconductor body had a thickness of approximately 500 $\mu$m. The p-doped cathode-side base region 2 and anode-side emitter region 4 have a thickness of approximately 4 $\mu$m and had been fabricated by ion implantation with a dose of $1 \times 10^{15}$ cm$^{-3}$ and an energy of 45 keV. The damaged regions were, as shown in FIG. 5, developed in the shape of islands and distributed uniformly over the anode-side emitter region 4. Their diameter b and their depth were approximately 10 $\mu$m. The distance a between the islands was around 100 $\mu$m. The damaged regions 10, thus occupy approximately 1% of the area of region 4. Depending on the requirements, it is possible to vary this area, for example, between 0.5 and 10%.

The damaged regions 10 may, as is shown in FIG. 6, also be formed in the shape of strips. The strips extend parallel to each other. It is also possible to arrange the damaged regions 10 as a grid of crossing strip-shaped regions. In FIGS. 6 and 7 also the fraction of the damaged regions of the area of region 4 can be between 0.5 and 10%, preferably around 1%.

The embodiment examples relate to semiconductor structural elements whose cathode-side emitter region is a doped semiconductor region. However, it may also consist of a metal silicon compound, for example of platinum silicide.

What we claim is:

1. A power semiconductor structural element comprising:
   at least one cathode-side emitter region;
   at least one cathode-side base region;
   a central region; and
   at least one anode-side emitter region, forming a pn-junction with said central region, and containing regions damaged by laser energy wherein:
   said damaged regions extend through said pn-junction between said anode-side emitter region and central region up into said central region.

2. The power semiconductor structural element of claim 1, wherein said damaged regions occupy between 0.5 and 10% of the area of said anode-side emitter region.

3. The power semiconductor structural element of claim 1, wherein said damaged regions are insular and distributed uniformly over said anode-side emitter region.

4. The power semiconductor structural element of claim 1, wherein said damaged regions are strip-shaped and arranged parallel to each other.

5. The power semiconductor structural element of claim 1, wherein said damaged regions are strip-shaped and form a grid.

* * * * *